(12) United States Patent
Yun et al.

(10) Patent No.: US 8,050,133 B2
(45) Date of Patent: Nov. 1, 2011

(54) WORD LINE DRIVER, METHOD FOR DRIVING THE WORD LINE DRIVER, AND SEMICONDUCTOR MEMORY DEVICE HAVING THE WORD LINE DRIVER

(75) Inventors: Tae-Sik Yun, Gyeonggi-do (KR); Kang-Seol Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 404 days.

(21) Appl. No.: 12/327,541

(22) Filed: Dec. 3, 2008

(65) Prior Publication Data

US 2009/0323455 A1 Dec. 31, 2009

(30) Foreign Application Priority Data

Jun. 30, 2008 (KR) ........................ 10-2008-0063186

(51) Int. Cl.
*G11C 8/00* (2006.01)
(52) U.S. Cl. ............................. 365/230.06; 365/230.03
(58) Field of Classification Search ............. 365/230.06, 365/230.03
See application file for complete search history.

(56) References Cited

U.S. PATENT DOCUMENTS

2008/0049539 A1* 2/2008 Miyata ..................... 365/230.06
2008/0225628 A1* 9/2008 Han et al. ................. 365/230.06
2009/0201753 A1* 8/2009 Riho et al. ..................... 365/200

FOREIGN PATENT DOCUMENTS

KR 1020010055932 A 7/2001
KR 1020040054362 A 6/2004
KR 1020060054573 A 5/2006

OTHER PUBLICATIONS

Notice of Allowance issued from Korean Intellectual Property Office on Jun. 3, 2010.
Notice of Preliminary Rejection issued from Korean Intellectual Property Office on Nov. 5, 2009.

* cited by examiner

*Primary Examiner* — Vu Le
(74) *Attorney, Agent, or Firm* — IP & T Group LLP

(57) ABSTRACT

A word line driver, a method for driving the word line driver, and a semiconductor memory device having the word line driver. The word line driver receives a main word line driving signal and a sub word line driving signal, to drive a word line with a word line driving signal, wherein the word line is driven concurrently with an activation of the main word line driving signal. The word line driver can reduce the unnecessary current consumption.

25 Claims, 10 Drawing Sheets

WORD LINE DRIVER, METHOD FOR DRIVING THE WORD LINE DRIVER, AND SEMICONDUCTOR MEMORY DEVICE HAVING THE WORD LINE DRIVER

CROSS-REFERENCE TO RELATED APPLICATION

The present invention claims priority of Korean patent application number 10-2008-0063186, filed on Jun. 30, 2008, which is incorporated by reference in its entirety.

BACKGROUND OF THE INVENTION

The present invention relates to a fabrication technology of a semiconductor memory device, and more particularly, to a word line driver, a method for driving the word line driver, and a semiconductor memory device having the word line driver.

A semiconductor memory device includes a word line, a bit line, and a memory cell. The word line is connected to a transistor having a gate receiving a boosted voltage (VPP). The boosted voltage (VPP) is generated by boosting an external power supply voltage (VDD) and thus its voltage level is higher than that of the power supply voltage (VDD). To drive the word line, the semiconductor memory device includes as many word line drivers as word lines.

FIG. 1 is a circuit diagram of a typical word line driver.

Referring to FIG. 1, the typical word line includes a first transistor PMOS1 enabling a word line WL in response to an activation of a main word line driving signal MWLB, a second transistor NMOS1 disabling the word line WL in response to a deactivation of the main word line driving signal MWLB, and a third transistor NMOS3 disabling the word line WL in response to an activation of a sub word line driving signal FXB.

The first transistor PMOS1 is connected to a word line driving signal FX having a level of a boosted voltage (VPP). The word line driving signal FX is a signal derived from the sub word line driving signal FXB. Specifically, the word line driving signal FX is generated by inverting the sub word line driving signal FXB through an inverter INV1. That is, the word line driver generates the word line driving signal FX by inverting the sub word line driving signal FXB, and drives the word line WL by using the word line driving signal FX.

FIG. 2 is a timing diagram of the signals MWLB, FXB and FX transferred to the word line driver.

Referring to FIG. 2, the main word line driving signal MWLB and the sub word line driving signal FXB are activated at the same time, while the word line driving signal FX is activated later than the main word line driving signal MWLB.

In this case, even though the main word line driving signal MWLB is transferred to the word line driver in order to drive the word line in an active operation, the word line driving signal FX actually driving the word line is activated late and thus the word line is driven when the word line driving signal FX is activated, not when the main word line driving signal MWLB is activated. That is, the time interval "A" is wasted.

Meanwhile, although the main word line driving signal MWLB and the sub word line driving signal FXB must be deactivated at the same time in a precharge operation, the deactivation timing of the word line driving signal FX is adjusted by deactivating the sub word line driving timing earlier in order to compensate the above-described time delay. Therefore, the first transistor PMOS1 and the third transistor NMOS2 maintain the driven state at the same time, thus forming an unnecessary direct current path. That is, an unnecessary current path is formed during the period "B". This causes a fatal defect in a semiconductor memory device sensitive to a current waste.

FIG. 3 is a block diagram for explaining the reason why the word line driving signal FX is activated later than the main word line driving signal MWLB in the typical semiconductor memory device.

As illustrated in FIG. 3, the typical semiconductor memory device includes a plurality of memory cell blocks 10 and a plurality of word line driver blocks 11.

The memory cell block 10 includes a plurality of word lines WL1 to WLn, and the word line driver block 11 includes a plurality of word line drivers WLD1 to WLDn respectively connected to the word lines WL1 to WLn. Each of the word line drivers WLD1 to WLDn represents the word line driver illustrated in FIG. 1.

Furthermore, the word line driver block 11 receives the main word line driving signal MWLB and the sub word line driving signal FXB. In order to reduce the number of signal lines, one word line driving signal MWLB and one sub word line driving signal FXB are input to one word line driver block 11. Thus, the word line driving signal MWLB and the sub word line driving signal FXB are input to the word line drivers WLD1 to WLDn in sequence, starting from the first word line driver WLD1.

In particular, after the sub word line driving signal FXB is transferred up to the nth word line driver WLDn, it is output as the word line driving signal FX by the inverter INV1, and the word line driving signal FX is transferred to the first word line driver WLD1. That is, the generation of the word line driving signal FX includes the time taken until at least the sub word line driving signal FXB is transferred to all the word line drivers WLD1 to WLDn and passes through the inverter INV1 to generate the word line driving signal FX.

Therefore, considering that the sub word line driving signal FXB and the main word line driving signal MWLB are activated at the same time, the word line driving signal FX is activated later than the main word line driving signal MWLB by the above-described time.

As described above, the word line of the typical semiconductor memory device is driven when the word line driving signal FX is activated, not when the main word line driving signal MWLB is activated.

The delayed activation the word line driving signal FX degrades a RAS-to-CAS delay (tRCD) characteristic, one of parameters representing operation characteristics of the semiconductor memory device. The RAS-to-CAS delay (tRCD) means the time taken from the timing when the word line is driven by the application of the active command to the timing when the read strobe signal is activated in response to the read command. Therefore, there is a need for an improved technology that can solve the above-described limitation.

SUMMARY OF THE INVENTION

Embodiments of the present invention are directed to providing a word line driver, which is capable of reducing a RAS-to-CAS delay (tRCD), a method for driving the word line driver, and a semiconductor memory device having the word line driver.

Embodiments of the present invention are directed to a word line driver, which is capable of reducing the unnecessary current consumption, a method for driving the word line driver, and a semiconductor memory device having the word line driver.

In accordance with an aspect of the present invention, there is provided a word line driver to receive a main word line driving signal and a sub word line driving signal, and to drive a word line with a word line driving signal, wherein the word line is driven concurrently with an activation of the main word line driving signal. The sub word line driving signal may be activated earlier than the main word line driving signal.

In accordance with another aspect of the present invention, there is provided a word line driver for driving a word line with a word line driving signal in response to a main word line driving signal and a sub word line driving signal, wherein the word line is driven at the same time as an activation timing of the main word line driving signal.

In accordance with another aspect of the present invention, there is provided a semiconductor memory device, which includes: a column decoder unit configured to receive a block selecting signal, a row address enable signal, a first control signal to generate a first driving signal, and a second control signal to generate a second driving signal; a first signal generating unit enabled in response to the activation of the first driving signal, to receive an address signal, and to output a sub word line driving signal; a second signal generating unit enabled in response to the activation of the second driving signal, to receive the address signal, and to output a main word line driving signal; and a word line driver unit configured to receive the sub word line driving signal, the second main word line driving signal, and a word line driving signal derived from the sub word line driving signal, and to drive a word line, wherein an activation of the first driving signal occurs before an activation of the second driving signal.

In accordance with yet another aspect of the present invention, there is provided a method for driving a word line driver for driving a word line with a word line driving signal in response to a main word line driving signal and a sub word line driving signal, the method including: driving the word line concurrently with an activation of the main word line driving signal.

DESCRIPTION OF SPECIFIC EMBODIMENTS

Other objects and advantages of the present invention can be understood by the following description, and become apparent with reference to the embodiments of the present invention.

In accordance with the present invention, the activation timing of a word line driving signal derived from a sub word line driving signal is advanced by activating the sub word line driving signal earlier than a main word line driving signal in an active operation. That is, the driving timing of the word line driver is advanced.

Furthermore, the formation of an unnecessary current path is prevented by deactivating the main word line driving signal earlier in a precharge operation.

Figure 1:
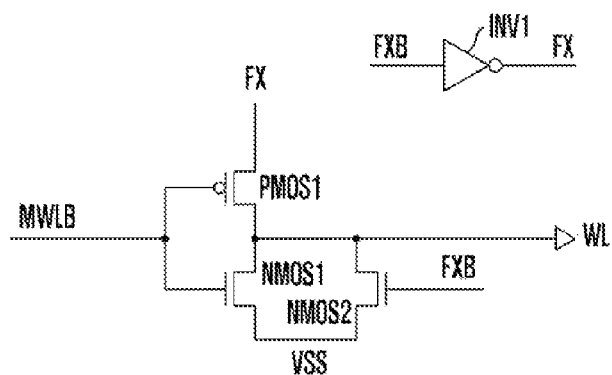
FIG. 1 is a circuit diagram of a typical word line driver.
Figure 2:
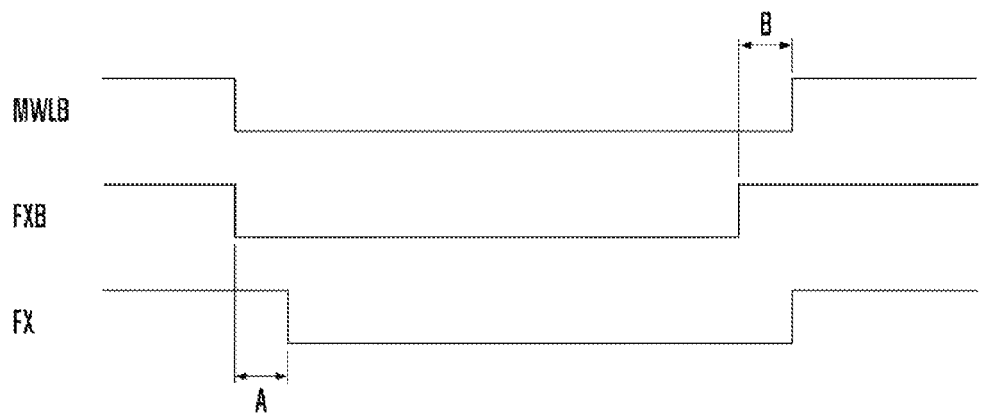
FIG. 2 is a timing diagram of signals transferred to a word line driver.
Figure 3:
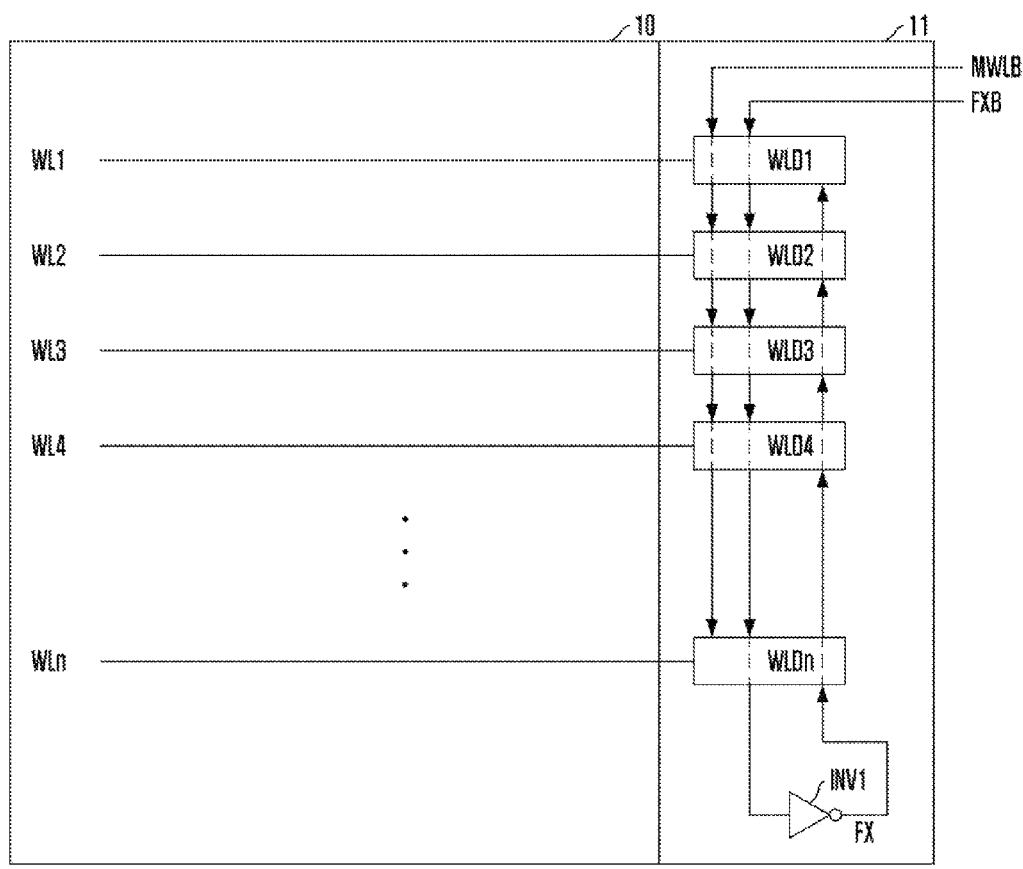
FIG. 3 is a block diagram for explaining the reason why a word line driving signal is activated later than a main word line driving signal in the typical semiconductor memory device.
Figure 4:
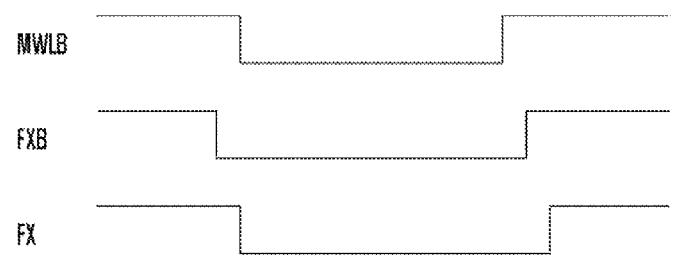
FIG. 4 is a timing diagram of a main word line driving signal, a sub word line driving signal, and a word line driving signal which are generated for driving a word line driver in accordance with an embodiment of the present invention.

FIG. 4 is a timing diagram of a main word line driving signal MWLB, a sub word line driving signal FXB, and a word line driving signal FX which are generated for driving a word line driver in accordance with an embodiment of the present invention.

As can be seen from FIG. 4, the activation timing of the word line driving signal FX is identical to that of the main word line driving signal MWLB. This is because the activation timing of the sub word line driving signal FXB is earlier than that of the main word line driving signal MWLB. In this case, it is important how earlier the sub word line driving signal FXB is activated, and the loading of the word line driving signal FX may be considered.

Therefore, in the active operation of the semiconductor memory device, the word line will be driven at the activation timing of the main word line driving signal MWLB, thereby reducing the RAS-to-CAS delay.

In addition, it can be seen that the deactivation timing of the main word line driving signal MWLB is earlier than the deactivation timing of the sub word line driving signal FXB in order to prevent generation of an unnecessary current path in the word line driver.

Consequently, the unnecessary current consumption of the semiconductor memory device can be reduced.

The main word line driving signal MWLB and the sub word line driving signal FXB having the above-described activation and deactivation timings are generated through the following signal generator.

Figure 5:
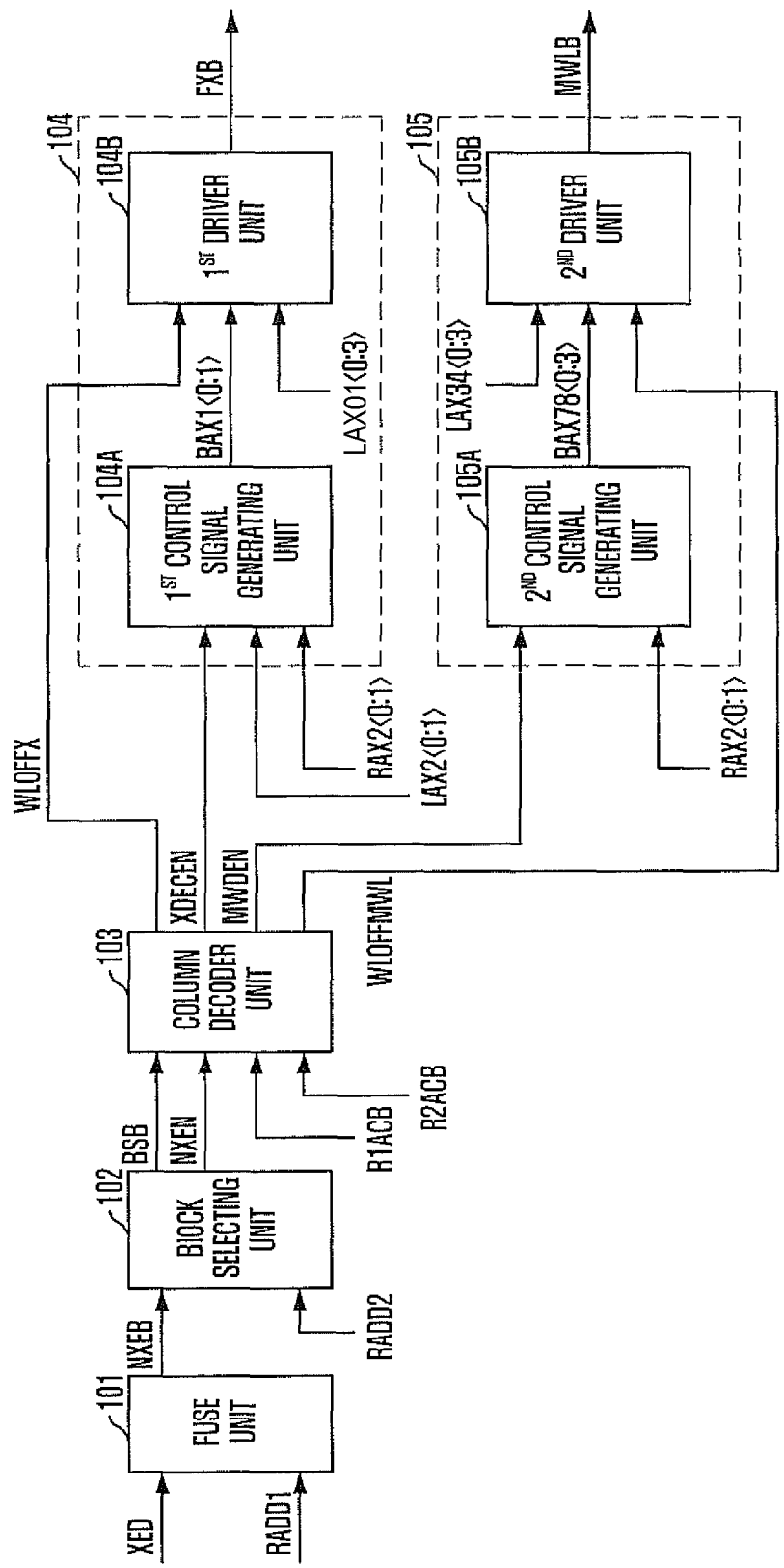
FIG. 5 is a circuit diagram illustrating a semiconductor memory device generating a main word line driving signal, a sub word line driving signal, and a word line driving signal.

FIG. 5 is a circuit diagram illustrating a semiconductor memory device generating the main word line driving signal MWLB, the sub word line driving signal FXB, and the word line driving signal FX.

Referring to FIG. 5, the semiconductor memory device includes a fuse unit 101, a block selecting unit 102, a column decoder unit 103, a first signal generating unit 104, and a second signal generating unit 105.

The fuse unit 101 receives a normal address detecting signal XED derived from a bank active signal, and a first row address signal RADD1 derived from a row address, and generates a source signal NXEB of a block selecting signal for selecting a part of memory cell blocks. The normal address detecting signal XED is a signal for detecting whether the row address input in a redundancy memory cell path corresponds to a normal memory cell area or a redundancy memory cell area.

The block selecting unit 102 receives the source signal NXEB of the block selecting signal, and a second row address signal RADD2 derived from the row address, and generates a block selecting signal BSB and a row address enable signal NXEN in order to select a part of blocks.

The column decoder unit 103 receives the block selecting signal BSB, the row address enable signal NXEN, a first control signal R1ACB and a second control signal R2ACB derived from the bank active signal, and generates a first word line disable signal WLOFFFX and a second word line disable signal WLOFFMWL for stopping the driving of the word line, a first signal generator enable signal XDECEN for enabling the first signal generating unit 104, and a second signal generator enable signal MWDEN for enabling the second signal generating unit 105.

Figure 6:
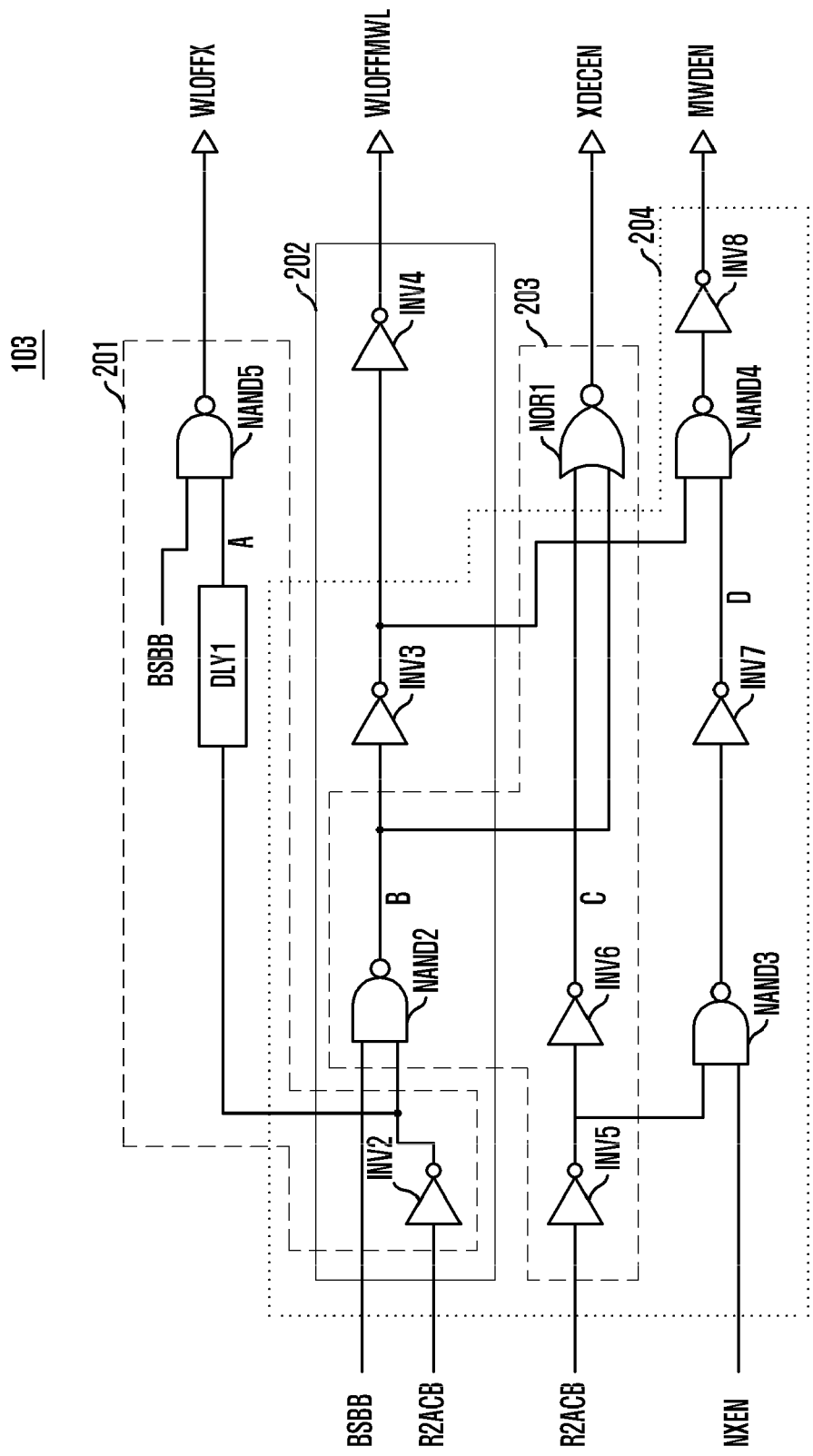
FIG. 6 is a circuit diagram of a row decoder in the semiconductor memory device of FIG. 5.

To this end, the column decoder unit 103 is configured with a circuit illustrated in FIG. 6.

Referring to FIG. 6, the column decoder unit 103 includes a first word line disable signal (WLOFFFX) generating unit 201, a second word line disable signal (WLOFFMWL) generating unit 202, a first signal generator enable signal (XDECEN) generating unit 203, and a second signal generator enable signal (MWDEN) generating unit 204.

The first word line disable signal (WLOFFFX) generating unit 201 includes a first inverter INV2 configured to invert the second control signal R2ACB derived from the bank active signal, a delay DLY1 configured to delay an output of the first inverter INV2, and first NAND gate NAND1 configured to receive an inverted block selecting signal BSBB, which is generated by inverting the block selecting signal BSB for selecting the block, and an output of the delay DLY1, and output the first word line disable signal WLOFFFX. The delay DLY1 may include a plurality of inverters or resistors to adjust a delay amount.

The second word line disable signal (WLOFFMWL) generating unit 202 includes a second NAND gate NAND2 configured to receive the inverted block selecting signal BSBB and the output of the first inverter INV2, and a second inverter INV3 and a third inverter INV4 configured to delay an output of the second NAND gate NAND2 to output the second word line disable signal WLOFFMWL.

The first signal generator enable signal (XDECEN) generating unit 203 includes a fourth inverter INV5 and a fifth inverter INV6 configured to delay the first control signal R1ACB, and a first NOR gate NOR1 configured to receive an output of the fifth inverter INV6 and the output of the second NAND gate NAND2 to output the first signal generator enable signal XDECEN.

The second signal generator enable signal (MWDEN) generating unit 204 includes a third NAND gate NAND3 configured to receive the row address enable signal NXEN and an output of the fourth inverter INV5, a sixth inverter INV7 configured to invert an output of the third NAND gate NAND3, a fourth NAND gate NAND4 configured to receives an output of the sixth inverter INV7 and an output of the second inverter INV3, and a seventh inverter INV8 configured to invert an output of the fourth NAND gate NAND4 to output the second signal generator enable signal MWDEN.

An operation of the column decoder unit 103 will be described below.

Figure 7:
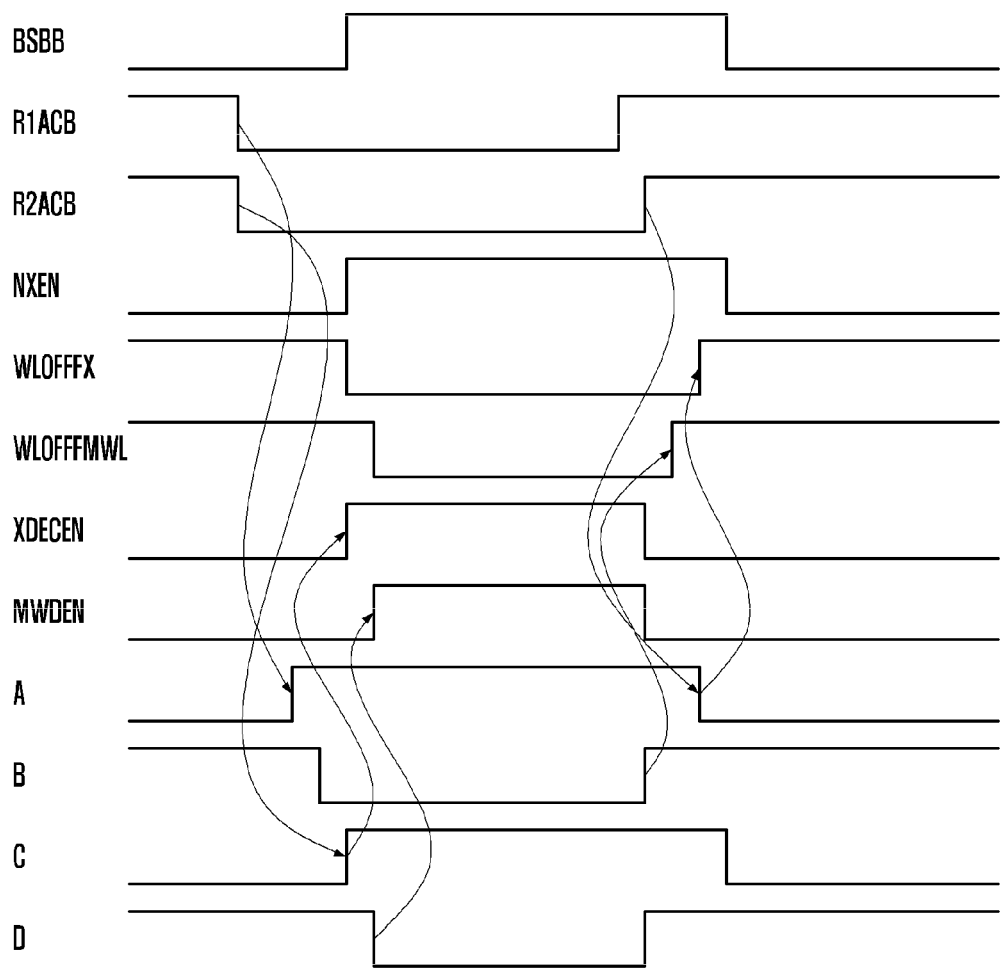
FIG. 7 is a timing illustrating the operation of a column decoder unit.

FIG. 7 is a timing diagram illustrating the operation of the column decoder unit 103.

Referring to FIG. 7, when the four signals BSBB, R1ACB, R2ACB and NXEN are input to the column decoder unit 103, the second control signal R2ACB is inverted and delayed to generate a signal A, and a NAND operation is performed on the signal A and the inverted block selecting signal BSBB. In this way, the first word line disable signal WLOFFFX activated at a rising edge of the signal A is generated.

The second control signal R2ACB is inverted, and a NAND operation is performed on the inverted second control signal and the inverted block selecting signal BSBB to generate a signal B. Then, the signal is delayed. In this way, the second word line disable signal WLOFFMWL activated at a falling edge of the signal B is generated. In this case, the second word line disable signal WLOFFMWL is activated earlier than the first word line disable signal WLOFFFX.

The first control signal R1ACB is delayed to generate a signal C, and a NOR operation is performed on the signal C and the signal B. In this way, the first signal generator enable signal XDECEN activated at a falling edge of the signal C is generated.

A NAND operation and an inversion operation are performed on the inverted first control signal and the row address enable signal NXEN to generate a signal D, and a NAND operation and an inversion operation are performed on the signal D and an inversion signal of the signal B. In this case, the signal D is delayed according to the inverter and the NAND gate. In this way, the second signal generator enable signal MWDEN is activated earlier than the first signal generator enable signal XDECEN.

Referring again to FIG. 6, the first signal generating unit 104 includes a first control signal generating unit 104A and a first driver unit 104B.

The first control signal generating unit 104A receives the first signal generator enable signal XDECEN, a 2-bit first address signal LAX2<0:1> generated by latching the row address as an active command, and a 2-bit second address signal RAX<0:1> indicating whether to select a redundancy memory cell, and outputs the first control signal BAX2<0:1> for controlling the first driver unit 104B.

Figure 8:
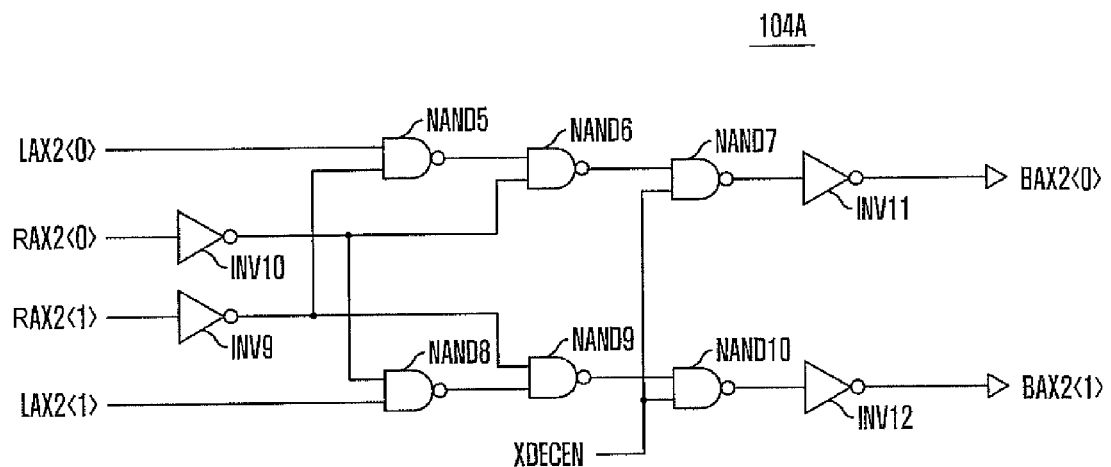
FIG. 8 is a circuit diagram illustrating a first control signal generating unit in the semiconductor memory device of FIG. 5.

To this end, the first control signal generating unit 104A is configured with a circuit illustrated in FIG. 8.

Referring to FIG. 8, the first control signal generating unit 104A includes a first NAND gate NAND5 configured to receive the 1-bit first address signal LAX2<0> of the 2-bit first address signal LAX2<0:1> and an inversion signal of the 1-bit second address signal RAX2<1> of the 2-bit second address signal RAX2<0:1>, a second NAND gate NAND6 configured to receive an inversion signal INV10 of the 1-bit second address signal RAX2<0> of the 2-bit second address signal RAX2<0:1> and an output of the first NAND gate NAND5, a third NAND gate NAND7 configured to receive an output of the second NAND gate NAND6 and the first signal generator enable signal XDECEN, and a first inverter INV11 configured to invert an output of the third NAND gate NAND7 to output the 1-bit first control signal BAX2<0>.

In addition, the first control signal generating unit 104A includes a fourth NAND gate NAND8 configured to receive the inversion signal INV10 of the 1-bit second address signal RAX2<0> of the 2-bit second address signal RAX2<0:1> and the 1-bit first address signal LAX2<1> of the 2-bit first address signal LAX2<0:1>, a fifth NAND gate NAND9 configured to receive an inversion signal INV9 of the 1-bit second address signal RAX2<1> of the 2-bit second address signal RAX2<0:1> and an output of the fourth NAND gate NAND8, a sixth NAND gate NAND10 configured to receive an output of the fifth NAND gate NAND9 and the first signal generator enable signal XDECEN, and a second inverter INV12 configured to invert an output of the sixth NAND gate NAND10 to output the 1-bit first control signal BAX2<1>.

The first driver unit 104B receives the 2-bit first control signal BAX2<0:1> and the first word line disable signal WLOFFFX as a driving control signal, and outputs a plurality of sub word line driving signals FXB1 to FXB4 in response to the selected address signal LAX01<0:3>. The address signal LAX01<0:3> is a signal derived from the row address, and has word line information.

Figure 9:
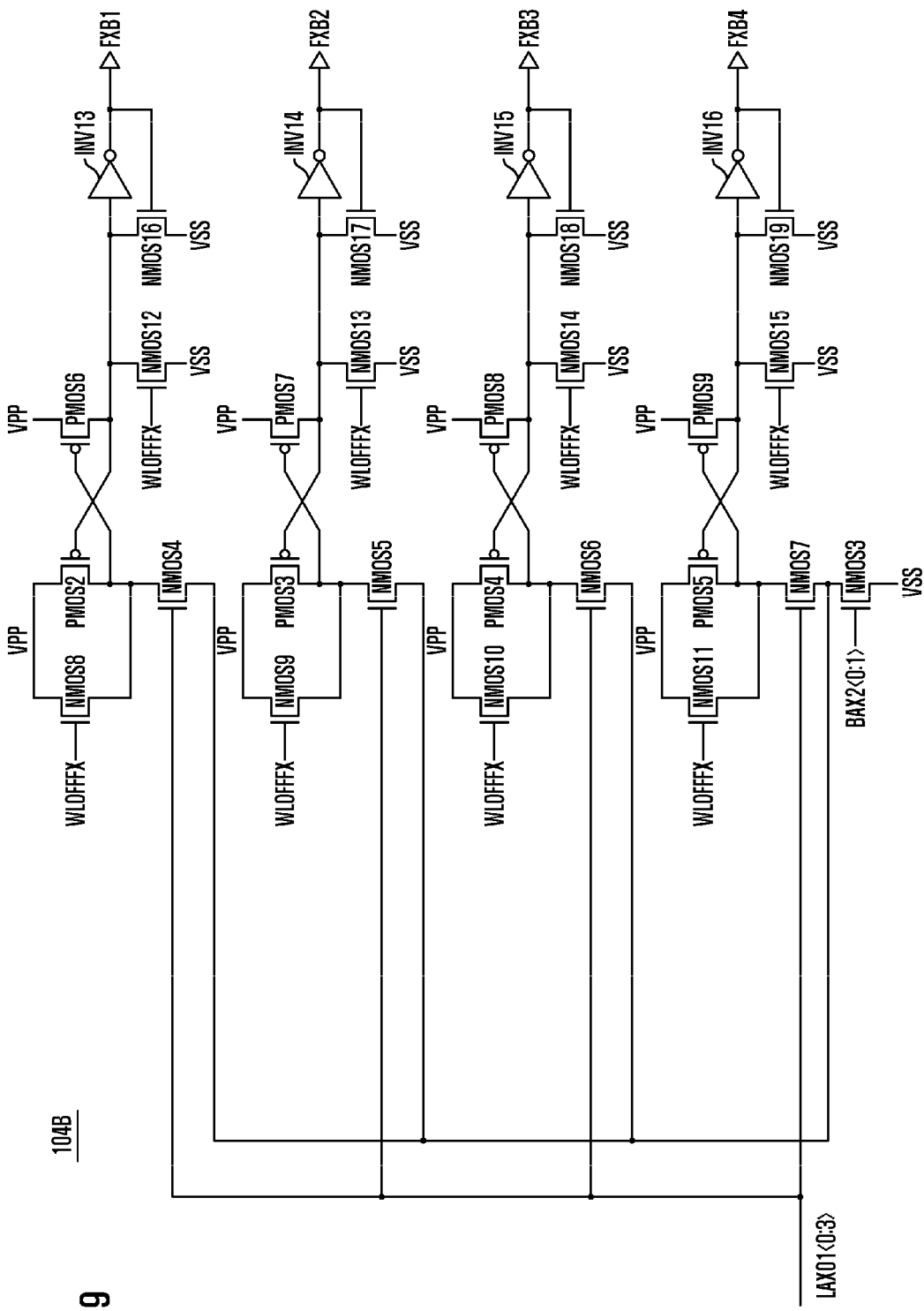
FIG. 9 is a circuit diagram illustrating a first driver unit in the semiconductor memory device of FIG. 5.

To this end, the first driver unit 104B is configured with a circuit illustrated in FIG. 9. It will be assumed that the first driver unit 104B receives a 4-bit address signal LAX01<0:3> to output four sub word line driving signals FXB1 to FXB4.

Referring to FIG. 9, the first driver unit 104B includes: a first transistor NMOS3 configured to drive the first driver unit 104B in response to the first control signal BAX2<0:1> received as the driving control signal; second to fifth transistors NMOS4 to NMOS7 connected in series to the first transistor NMOS3 to receive the address signals LAX01<0:3> to output basic signals for generating the sub word line driving signals FXB1 to FXB4; sixth to ninth transistors PMOS6 to PMOS9 and first to fourth inverters INV13 to INV16 configured to receive the basic signals of the second to fifth transistors NMOS4 to NMOS7 to activate the sub word line driving signals FXB1 to FXB4; tenth to thirteenth transistors NMOS8 to NMOS11, fourteenth to seventeenth transistors NMOS12 to NMOS15, and first to fourth inverters INV13 to INV16 configured to receive the first word line disable signal WLOFFFX to deactivate the sub word line driving signals FXB1 to FXB4; eighteenth to twenty-first transistors PMOS2 to PMOS5 configured to control the driving of the sixth to ninth transistors PMOS6 to PMOS9 in order to stabilize the operation of the first driver unit 104B; and twenty-second to twenty-fifth transistors NMOS16 to NMOS19 configured to lock the deactivation output of the sub word line driving signals FXB1 to FXB4.

Referring again to FIG. 5, the second signal generating unit 105 includes a second control signal generating unit 105A and a second driver unit 105B.

The second control signal generating unit 105A receives the second signal generator enable signal MWDEN and a 4-bit address signal LAX78<0:3> generated by latching the row address as the active command, and generates the second control signal BAX78<0:3> when the second signal generator enable signal MWDEN is activated.

Figure 10:
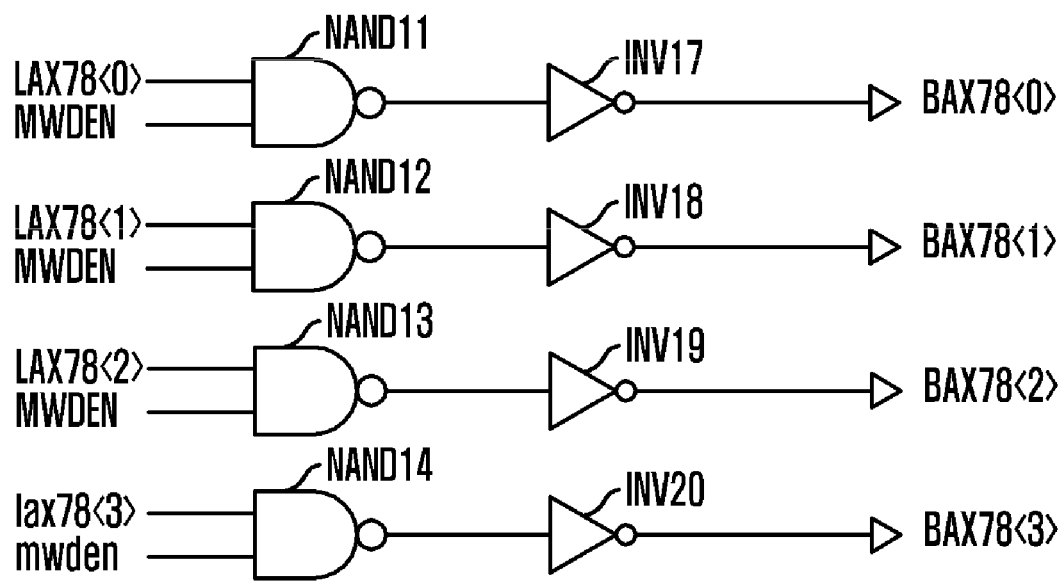
FIG. 10 is a circuit diagram illustrating a second control signal generating unit in the semiconductor memory device of FIG. 5.

To this end, the second control signal generating unit 105A is configured with a circuit illustrated in FIG. 10.

Referring to FIG. 10, the second control signal generating unit 105A includes: a first NAND gate NAND11 configured to receive the 1-bit address signal LAX78<0> of the 4-bit address signal LAX78<0:3> and the second signal generator enable signal MWDEN; a first inverter INV17 configured to invert an output of the first NAND gate NAND11 to generate the 1-bit second control signal BAX78<0>; a second NAND gate NAND12 configured to receive the 1-bit address signal LAX78<1> of the 4-bit address signal LAX78<0:3> and the second signal generator enable signal MWDEN; a second inverter INV18 configured to invert an output of the second NAND gate NAND12 to generate the 1-bit second control signal BAX78<1>; a third NAND gate NAND13 configured to receive the 1-bit address signal LAX78<2> and the second signal generator enable signal MWDEN; a third inverter INV19 configured to invert an output of the third NAND gate NAND13 to generate the 1-bit second control signal BAX78<2>; a fourth NAND gate NAND14 configured to receive the 1-bit address signal LAX78<3> of the 4-bit address signal LAX78<0:3> and the second signal generator enable signal MWDEN; and a fourth inverter INV20 configured to invert an output of the fourth NAND gate NAND14 to generate the 1-bit second control signal BAX78<3>.

The second driver unit 105B receives the 4-bit second control signal BAX78<0:1> and the second word line disable signal WLOFFMWL as a driving control signal, and outputs a plurality of main word line driving signals MWLB1 to MWLB4 in response to the selected address signal LAX34<0:3>. The address signal LAX34<0:3> is a signal derived from the row address, and has word line information.

Figure 11:
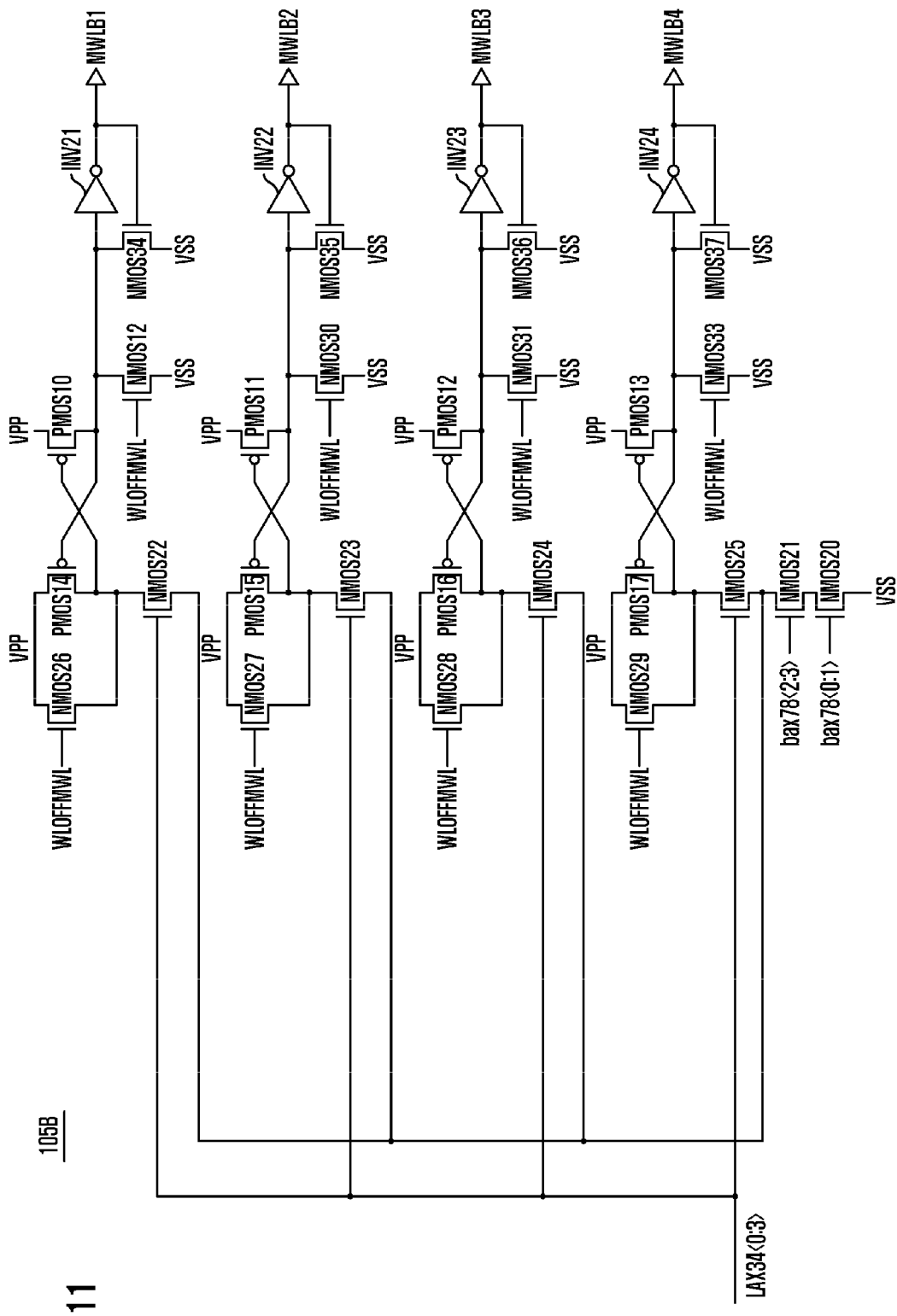
FIG. 11 is a circuit diagram illustrating a second driver unit in the semiconductor memory device of FIG. 5.

To this end, the second driver unit 105B is configured with a circuit illustrated in FIG. 11. It will be assumed that the second driver unit 105B receives a 4-bit address signal LAX34<0:3> to output four main word line driving signals MWLB1 to MWLB4.

Referring to FIG. 11, the second driver unit 105B includes: a first transistor NMOS20 and a second transistor NMOS21 configured to drive the second driver unit 105B in response to the second control signal BAX78<0:3> received as the driving control signal; third to sixth transistors NMOS22 to NMOS25 connected in series to the second transistor NMOS21 to receive the address signals LAX34<0:3> to output basic signals for generating the main word line driving signals MWLB1 to MWLB4; seventh to tenth transistors PMOS10 to PMOS13 and first to fourth inverters INV21 to INV24 configured to receive the basic signals of the third to sixth transistors NMOS22 to NMOS25 to activate the main word line driving signals MWLB1 to MWLB4; eleventh to fourteenth transistors NMOS26 to NMOS29, fifteenth to eighteenth transistors NMOS30 to NMOS33, and first to fourth inverters INV21 to INV24 configured to receive the second word line disable signal WLOFFMWL to deactivate the main word line driving signals MWLB1 to MWLB4; nineteenth to twenty-second transistors PMOS14 to PMOS17 configured to control the driving of the seventh to tenth transistors PMOS10 to PMOS13 in order to stabilize the operation of the second driver unit 105B; and twenty-third to twenty-sixth transistors NMOS34 to NMOS37 configured to lock the deactivation output of the main word line driving signals MWLB1 to MWLB4.

The sub word line driving signal FXB and the main word line driving signal MWLB generated in the above-described manner are transferred to the word line driver provided in each block and serve as the basic signals for driving a plurality of word lines.

Figure 12:
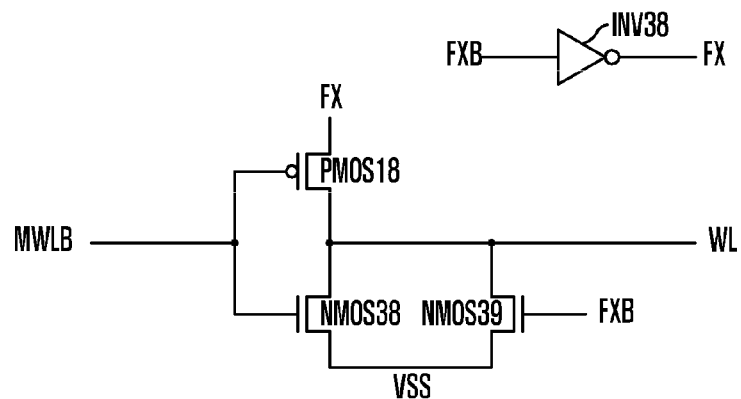
FIG. 12 is a circuit diagram illustrating a word line driver provided in a word line driving unit and individually connected to a plurality of word lines.

FIG. 12 is a circuit diagram illustrating a word line driver provided in a word line driving unit and individually connected to a plurality of word lines.

Referring to FIG. 12, the word line driver includes a first transistor PMOS18 configured to enable a word line WL in response to an activation of a main world line driving signal MWLB, a second transistor NMOS38 configured to disable the word line WL in response to a deactivation of the main world line driving signal MWLB, and a third transistor NMOS39 configured to disable the word line WL in response to an activation of a sub word line driving signal FXB.

The first transistor PMOS18 is connected to a word line driving signal FX having a level of a boosted voltage VPP. The word line driving signal FX corresponds to an inversion signal of the sub word line driving signal FXB. That is, the word line driver generates the word line driving signal FX by inverting the sub word line driving signal FXB, and drives the word line WL by using the word line driving signal FX.

The timing for driving the word line driver will be described below.

Figure 13:
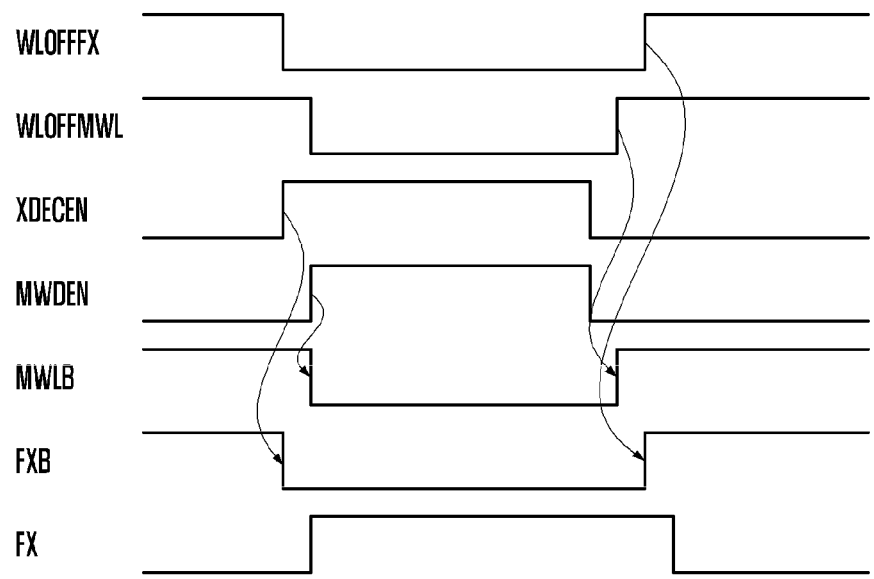
FIG. 13 is a timing diagram of a main word line driving signal, a sub word line driving signal, and a word line driving signal which are generated for driving the word line driver in accordance with the embodiment of the present invention.

FIG. 13 is a timing diagram of the main word line driving signal MWLB, the sub word line driving signal FXB, and the word line driving signal FX which are generated for driving the word line driver in accordance with the embodiment of the present invention.

Referring to FIG. 13, in the active operation, the activation timing of the main word line driving signal MWLB is defined by the activation timing of the second signal generator enable signal MWDEN, and the activation timing of the sub word line driving signal FXB is determined by the activation timing of the first signal generator enable signal XDECEN.

In this case, since the activation timing of the first signal generator enable signal XDECEN is earlier than the activation timing of the second signal generator enable signal MWDEN, the sub word line driving signal FXB is activated earlier than the main word line driving signal MWLB. Therefore, the activation timing of the word line driving signal FX is the same as or earlier than the activation timing of the main word line driving signal MWDEN. Thus, the driving time of the word line becomes faster than the related art. That is, the RAS-to-CAS delay (tRCD) is reduced.

In the precharge operation, the deactivation timing of the main word line driving signal MWLB is defined by the activation timing of the second word line disable signal WLOFFMWL, and the deactivation timing of the sub word line driving signal FXB is defined by the activation timing of the first word line disable signal WLOFFFX.

In this case, since the deactivation timing of the second word line disable signal WLOFFMWL is earlier than the deactivation timing of the first word line disable signal WLOFFFX, the main word line driving signal MWLB is deactivated earlier than the sub word line driving signal FXB. Therefore, the path of the word line driving signal FX is cut off by the disabling of the first transistor PMOS34. That is, since an unnecessary current path is does not formed, an unnecessary current consumption of the semiconductor memory device can be reduced.

In the above embodiment, the enable timing of the first driver unit 104B is different from the enable timing of the second driver unit 105B, and thus, the activation timing of the sub word line driving signal FXB becomes different from that of the main word line driving signal MWLB. That is, the activation timing of the sub word line driving signal FXB is earlier than the activation timing of the main word line driving signal MWLB. In this case, it should be considered a loading until the sub word line driving signal FXB is converted into the word line driving signal FX and reaches the word line driver at the same time as or earlier than the activation timing of the main word line driving signal MWLB.

Furthermore, the main word line driving signal MWLB is deactivated earlier than the sub word line driving signal FXB. Thus, the path of the word line driving signal FX is cut off by the disabling of the first transistor PMOS34. That is, since an unnecessary current path is does not formed, an unnecessary current consumption of the semiconductor memory device can be reduced.

While the present invention has been described with respect to the specific embodiments, it will be apparent to those skilled in the art that various changes and modifications may be made without departing from the spirit and scope of the invention as defined in the following claims.

What is claimed is:

1. A word line driver for driving a word line with a word line driving signal in response to a main word line driving signal and a sub word line driving signal, wherein the word line is driven at the same timing as an activation timing of the main word line driving signal is activated, wherein the main word line driving signal is deactivated after the activation timing of the main word line driving signal but earlier than a deactivation timing of the sub word line driving signal.

2. The word line driver of claim 1, wherein the sub word line driving signal is activated earlier than the main word line driving signal.

3. The word line driver of claim 2, wherein the word line driving signal is a signal derived from the sub word line driving signal.

4. The word line driver of claim 1, wherein the word line driving signal is activated at the same time as or earlier than the main word line driving signal.

5. The word line driver of claim 1, wherein the word line driving signal has a level of a boosted voltage.

6. The word line driver of claim 1, wherein the main word line driving signal is deactivated earlier than the word line driving signal.

7. A semiconductor memory device, comprising:
a column decoder unit configured to receive a block selecting signal, a row address enable signal, a first control signal to generate a first driving signal, and a second control signal to generate a second driving signal;
a first signal generating unit enabled in response to the activation of the first driving signal to receive an address signal and to output a sub word line driving signal;
a second signal generating unit enabled in response to the activation of the second driving signal to receive the address signal and to output a main word line driving signal; and
a word line driver unit configured to receive the sub word line driving signal, the second main word line driving signal, and a word line driving signal derived from the sub word line driving signal and to drive a word line,
wherein an activation of the first driving signal occurs before an activation of the second driving signal.

8. The semiconductor memory device of claim 7, wherein the word line driver is configured to activate the sub word line driving signal before the main word line driving signal.

9. The semiconductor memory device of claim 7, wherein the word line driver is configured to activate the sub word line driving signal concurrently with or before the main word line driving signal.

10. The semiconductor memory device of claim 7, wherein the word line driver is configured to provide the word line driving signal at a boosted power voltage higher than a base power voltage.

11. The semiconductor memory device of claim 7, wherein the column decoder unit comprises:
a first driving signal generating unit configured to receive the block selecting signal, the first control signal, and the second control signal and to generate the first driving signal; and
a second driving signal generating unit configured to receive the block selecting signal, the row address enable signal, the first control signal, and the second control signal and to generate the second driving signal.

12. The semiconductor memory device of claim 7, wherein the first signal generating unit comprises:
a first control signal generating unit configured to receive the first driving signal, a first 2-bit address signal generated by latching the row address indicating an active command, and a second 2-bit address signal indicating whether to select a redundancy memory cell, and output a first 2-bit control signal; and
a first driver unit configured to receive the first 2-bit control signal and a selected address signal, and output the sub word line driving signal.

13. The semiconductor memory device of claim 7, wherein the second signal generating unit comprises:
  a second control signal generating unit configured to receive the second driving signal and a first 4-bit address signal, and output a second 4-bit control signal; and
  a second driver unit configured to receive the second 4-bit control signal and a selected address signal, and output the main word line driving signal,
  wherein the first 4-bit address signal is generated by latching the row address and indicates an active command.

14. The semiconductor memory device of claim 7, wherein the word line driver is configured to deactivate the main word line driving signal before the sub word line driving signal.

15. The semiconductor memory device of claim 7, wherein the word line driver is configured to deactivate the main word line driving signal before the word line driving signal.

16. The semiconductor memory device of claim 7, wherein the column decoder unit receives the block selecting signal and the second control signal to generate a first word line disable signal and a second word line disable signal,
  wherein the second word line disable signal is activated before the first word line disable signal.

17. The semiconductor memory device of claim 7, wherein the column decoder unit comprises:
  a first word line disable signal generating unit to receive the block selecting signal and a delayed signal of the second control signal, and to generate a first word line disable signal; and
  a second word line disable signal generating unit to receive the block selecting signal and the second control signal, and to generate a second word line disable signal,
  wherein the first word line disable signal is activated at a rising edge of the delayed signal of the second control signal, and
  wherein the second word line disable signal is activated before the first word line disable signal.

18. The semiconductor memory device of claim 16, wherein the first signal generating unit receives the first word line disable signal to deactivate the sub word line driving signal, and the second signal generating unit receives the second word line disable signal to deactivate the main word line driving signal.

19. A method for driving a word line driver for driving a word line with a word line driving signal in response to a main word line driving signal and a sub word line driving signal, the method comprising:
  driving the word line concurrently with an activation of the main word line driving signal,
  wherein the main word line driving signal is deactivated after the activation of the main word driving signal but earlier than the sub word line driving signal.

20. The method of claim 19, further comprising generating the word line driving signal from the sub word line driving signal.

21. The method of claim 19, further comprising activating the word line driving signal concurrently with or before the main word line driving signal.

22. The method of claim 19, further comprising deactivating the main word line driving signal before the sub word line driving signal.

23. The method of claim 19, further comprising deactivating the main word line driving signal before the word line driving signal.

24. The word line driver of claim 1, wherein the main word line driving signal in being deactivated switches to a high voltage logic level.

25. The method of claim 19, wherein the main word line driving signal in being deactivated switches to a high voltage logic level.

* * * * *